United States Patent
Carpentier et al.

(10) Patent No.: US 10,181,654 B2
(45) Date of Patent: Jan. 15, 2019

(54) INTEGRATED MILLIMETER WAVE TRANSCEIVER

(71) Applicant: STMICROELECTRONICS SA, Montrouge (FR)

(72) Inventors: Jean-Francois Carpentier, Grenoble (FR); Sébastien Pruvost, Froges (FR); Patrice Garcia, Crolles (FR); Pierre Busson, Grenoble (FR); Pierre Dautriche, Montbonnot (FR)

(73) Assignee: STMicroelectronics SA, Montrouge (FR)

( * ) Notice: Subject to any disclaimer, the term of this patent is extended or adjusted under 35 U.S.C. 154(b) by 441 days.

(21) Appl. No.: 14/869,811

(22) Filed: Sep. 29, 2015

(65) Prior Publication Data

US 2016/0020524 A1    Jan. 21, 2016

Related U.S. Application Data

(63) Continuation of application No. 13/332,031, filed on Dec. 20, 2011, now Pat. No. 9,257,754.

(30) Foreign Application Priority Data

Dec. 20, 2010    (FR) .................................... 10 60851

(51) Int. Cl.
  *H01Q 21/00*        (2006.01)
  *H01Q 23/00*        (2006.01)
  (Continued)

(52) U.S. Cl.
  CPC ..... *H01Q 21/0087* (2013.01); *H01L 23/3114* (2013.01); *H01L 23/49816* (2013.01);
  (Continued)

(58) Field of Classification Search
  CPC .......... H01C 3/34; H01C 3/44; H01C 5/0079; H01C 19/10; H01C 1/246
  (Continued)

(56) References Cited

U.S. PATENT DOCUMENTS 5,128,689 A    7/1992  Wong et al.
5,657,024 A    8/1997  Shingyoji et al.
(Continued)

FOREIGN PATENT DOCUMENTS

JP    2001-28413 A    1/2001
KR    10-0780328 B1   11/2007
WO    2005093902 A1   10/2005

OTHER PUBLICATIONS

Lee et al., "A low-power fully integrated 60GHz transceiver system with OOK modulation and on-board antenna assembly," IEEE International Solid-State Circuits Conference, Feb. 8-12, 2009, San Francisco, CA, 3 pages.

*Primary Examiner* — Dameon E Levi
*Assistant Examiner* — Collin Dawkins
(74) *Attorney, Agent, or Firm* — Seed IP Law Group LLP

(57) ABSTRACT

A millimeter wave transceiver including a plate forming an interposer having its upper surface supporting an interconnection network and having its lower surface intended to be assembled on a printed circuit board by bumps; an integrated circuit chip assembled on the upper surface of the interposer; antennas made of tracks formed on the upper surface of the interposer; and reflectors on the upper surface of the printed circuit board in front of each of the antennas, the effective distance between each antenna and the reflector plate being on the order of one quarter of the wavelength, taking into account the dielectric constants of the interposed materials.

19 Claims, 3 Drawing Sheets

(51) Int. Cl.
*H01L 23/498* (2006.01)
*H01L 23/66* (2006.01)
*H01L 23/00* (2006.01)
*H01Q 19/00* (2006.01)
*H01Q 19/10* (2006.01)
*H01Q 19/185* (2006.01)
*H01L 23/31* (2006.01)
*H01L 23/552* (2006.01)

(52) U.S. Cl.
CPC ........ *H01L 23/49838* (2013.01); *H01L 23/66* (2013.01); *H01L 24/13* (2013.01); *H01Q 19/005* (2013.01); *H01Q 19/10* (2013.01); *H01Q 19/185* (2013.01); *H01Q 21/0025* (2013.01); *H01Q 21/0093* (2013.01); *H01Q 23/00* (2013.01); *H01L 23/3128* (2013.01); *H01L 23/552* (2013.01); *H01L 2223/6677* (2013.01); *H01L 2224/1319* (2013.01); *H01L 2224/13582* (2013.01); *H01L 2224/16225* (2013.01); *H01L 2924/014* (2013.01); *H01L 2924/14* (2013.01); *H01L 2924/15311* (2013.01)

(58) Field of Classification Search
USPC .................................... 343/836, 834, 700 MS
See application file for complete search history.

(56) References Cited

U.S. PATENT DOCUMENTS

| | | |
|---|---|---|
| 5,666,128 A | 9/1997 | Murray et al. |
| 6,068,259 A | 5/2000 | Dolin |
| 7,545,323 B2 | 6/2009 | Kalian et al. |
| 7,551,136 B1 | 6/2009 | Kalian et al. |
| 2002/0135519 A1 | 9/2002 | Luch |
| 2004/0217472 A1 | 11/2004 | Aisenbrey et al. |
| 2005/0134507 A1 | 6/2005 | Dishongh et al. |
| 2008/0029886 A1 | 2/2008 | Cotte et al. |
| 2008/0048307 A1 | 2/2008 | Nakatani et al. |
| 2008/0158091 A1 | 7/2008 | Imaoka et al. |
| 2008/0186247 A1 | 8/2008 | Cotte et al. |
| 2009/0322643 A1* | 12/2009 | Choudhury .......... H01Q 1/2291 343/851 |
| 2010/0007571 A1 | 1/2010 | Riedel |
| 2010/0193935 A1* | 8/2010 | Lachner .............. H01L 23/3135 257/693 |
| 2010/0219523 A1 | 9/2010 | Chow et al. |
| 2010/0225539 A1 | 9/2010 | Margomenos et al. |
| 2010/0289713 A1 | 11/2010 | Taura |
| 2011/0032685 A1 | 2/2011 | Akiba et al. |

* cited by examiner

INTEGRATED MILLIMETER WAVE TRANSCEIVER

BACKGROUND

Technical Field

The present disclosure relates to transceiver systems capable of operating with millimeter waves and capable of issuing and receiving signals from devices arranged at distances greater than one meter, for example, on the order of 10 meters.

Description of the Related Art

In a system operating with millimeter waves, for example, at a frequency on the order of 60 GHz, the available powers are such that antenna arrays providing directional beams, often called phased arrays, have to be provided. In such arrays, each antenna transmits a signal which is phase-shifted with respect to that of the other antennas, or is capable of receiving a signal which is phase-shifted with respect to that of the other antennas.

At 60 GHz, the wavelength in air is 5 mm. The largest dimension of antennas currently is on the order of half the wavelength, that is, 2.5 mm, and each antenna is separated from the surrounding antennas by a distance at least of the same order of magnitude.

Accordingly, it is in practice impossible to arrange the antenna array on an integrated circuit chip which contains electronic circuits capable of providing, receiving, processing, and amplifying the high-frequency signals of the antennas. This would indeed result in prohibitive chip dimensions.

Known devices have often used antennas assembled on individual substrates inserted in a ceramic block, also intended to receive the integrated processing circuit. This makes the system relatively complex, all the more as the track lengths between each of the elements should be made the shortest possible to avoid stray radiations and interferences. Further, some of those systems force the card manufacturer to provide relatively complicated devices to process the transmitted/received signals.

BRIEF SUMMARY

Thus, an embodiment provides a system forming a single assembly comprising a circuit of high-frequency signal transmission, reception, processing, and amplification, and an array of transceiver antennas of minimum bulk, especially capable of being simply assembled on a printed circuit board.

An embodiment provides a millimeter wave transceiver comprising a plate forming an interposer having its upper surface supporting an interconnection network and having its lower surface intended to be assembled on a printed circuit board by bumps; an integrated circuit chip assembled on the upper surface of the interposer; antennas made of tracks formed on the upper surface of the interposer; and reflectors on the upper surface of the printed circuit board in front of each of the antennas, the effective distance between each antenna and the reflector plate being on the order of one quarter of the wavelength, taking into account the dielectric constants of the interposed materials.

According to an embodiment, each of the antennas is surrounded with a surrounding conductive track, a corresponding surrounding conductive track being provided on the lower surface of the interposer, the tracks being connected by a network of through vias, the conductive track on the lower portion of the interposer being connected to a conductive track surrounding the reflector by a bump network.

According to an embodiment, the bumps are polymer bumps coated with a conductor and with a solder layer.

According to an embodiment, the interposer is a silicon plate.

According to an embodiment, the interposer is a glass plate.

According to an embodiment, the upper surface is coated with an encapsulation resin.

According to an embodiment, the conductive track surrounding the reflector is in contact with a peripheral portion of this reflector.

According to an embodiment, the reflector and the surrounding tracks are grounded.

The foregoing and other features and advantages will be discussed in detail in the following non-limiting description of specific embodiments in connection with the accompanying drawings.

BRIEF DESCRIPTION OF THE SEVERAL VIEWS OF THE DRAWINGS

For clarity, the same elements have been designated with the same reference numerals in the different drawings and, further, as usual in the representation of integrated circuits, the various drawings are not to scale.

DETAILED DESCRIPTION

Figure 1:
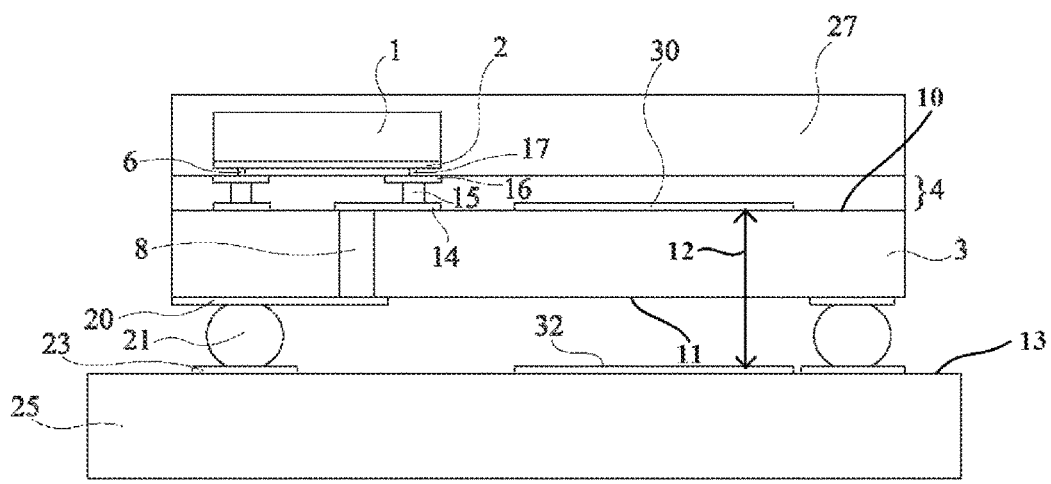
FIG. 1 is a simplified cross-section view of a portion of an integrated transceiver system.

FIG. 1 is a very simplified cross-section view of a millimeter wave transceiver assembly. This assembly comprises an integrated circuit chip 1 comprising various circuits for processing and amplifying high-frequency signals transmitted/received by antennas. On the lower side of the chip, a layer 2 actually formed of an assembly of conductive and insulating layers forming interconnection levels intended for the interconnection of the various chip components and the connection of these components to the outside has been shown.

Chip 1 is assembled on an interposer plate 3. This plate is topped with an interconnection network 4 comprising insulating layers, metal tracks, and conductive vias. Chip 1 is for example assembled on interposer plate 3 via conductive pillars 6, for example, made of copper.

In interposer plate 3, which for example is a silicon or glass plate, are formed insulated conductive through vias 8, a single one being shown. On the upper surface 10 of the interposer plate, a metallized region 14, a via 15, and a metallized region 16 connected by a pillar 17 to a terminal of chip 1 have been shown. Metallizations 20 actually comprising, in practice, an assembly of metallizations to which bumps 21 are attached (welded), are formed on the lower side of the interposer plate.

On the upper surface 10 of interposer plate 3 are arranged antennas 30 formed of conductive tracks according to any antenna configuration suitable for the transmission and/or the reception of millimeter waves. Although a single antenna appears in the cross-section view of FIG. 1, it should be understood that there is a number of transmitting antennas and a number of receiving antennas which are connected by metallization levels, not shown, of interconnection network 4 to appropriate terminals of chip 1 so that, in operation, each of these antennas is excited with a given phase-shift with respect to the other antennas.

Chip 1, interposer plate 3, and bumps 21 form an assembly ready to be delivered by a manufacturer to a system assembler which assembles the above-mentioned assembly on another electronic device, for example, a printed circuit board 25 on which metallizations 23 capable of receiving bumps 21 are formed. The upper surface of this assembly is preferably encapsulated in an insulating body 27, for example, made of resin, to protect the product and possibly mark it.

An antenna 30 transmits, when excited, a high-frequency radiation, upwards as well as downwards. To improve the efficiency of the antenna 30 and avoid stray radiations, the beam that this antenna sends downwards is sent back up. For this purpose, it is provided to arrange on printed circuit board 25 a reflector 32 in front of antenna 30. This reflector 32 is formed of a metallization and is arranged at a vertical distance 12 on the order of $\lambda/4$ of the antenna, $\lambda$ being the wavelength of the radiation. Of course, the calculation of distance $\lambda/4$ takes into account the fact that the space between the antenna and the reflector comprises the thickness of the interposer plate 3, having a dielectric constant on the order of 12 if this interposer plate 3 is made of silicon, and an air gap having a dielectric constant equal to 1, as well as possibly, a small insulator thickness between the antenna and the interposer plate 3. The thickness of the interposer plate 3 is accurately known and the height of the air gap is also accurately determined according to the distance set by bumps 21. Bumps 21 having a thickness after assembly that can be well determined, for example, bumps of a hard polymer coated with a conductive layer and with a solder layer, will be selected.

According to an advantage of the above-described system, the connections between the chip and the antennas may have well-determined minimum lengths.

Figure 2A:
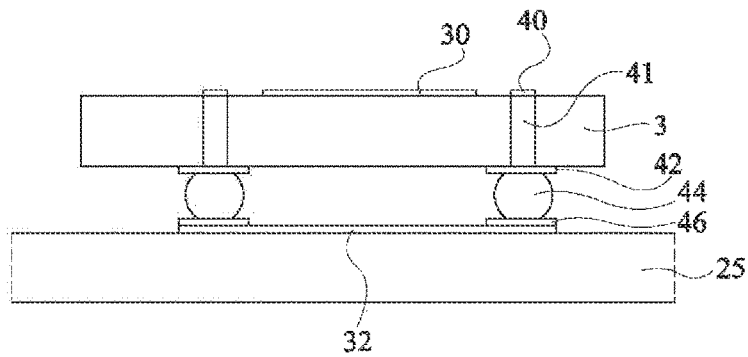
FIG. 2A is a simplified cross-section view of an antenna portion of the transceiver system of FIG. 1.
Figure 2B:
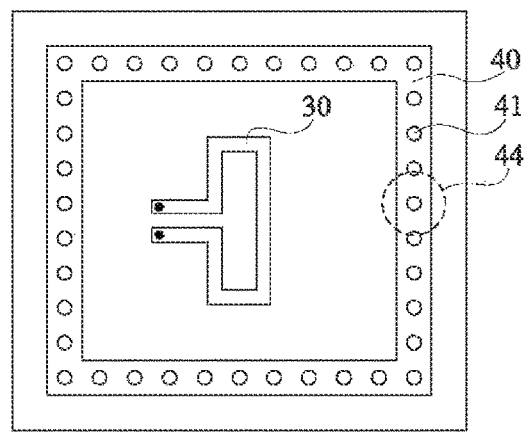
FIG. 2B is a top view corresponding to the cross-section view of FIG. 2A.

FIGS. 2A and 2B are a cross-section view and a top view of an antenna portion of the transceiver system of FIG. 1. As previously indicated, antenna 30 is made of a conductive track formed on the interposer plate 3 and connected by metallizations, not shown, to terminals of chip 1; interposer plate 3 comprises insulated through vias; and printed circuit board 25 comprises in front of antenna portion 30 a metallization forming a reflector 32. Antenna 30, a simplified example of which has been shown in FIG. 2B, is surrounded with a conductive track 40 connected by conductive vias 41 to a corresponding surrounding conductive track 42 formed under interposer plate 3. Vias 41 are regularly distributed along the conductive track. Surrounding track 42 is connected by a number of bumps 44, one of which is shown in dotted lines in FIG. 2B, to reflector plate 32 on printed circuit board 25. Given that in most technologies, bumps have a diameter (for example, 0.5 mm) much greater than the lateral dimensions of a via (for example, 0.2 mm), the number of bumps will be smaller than the number of vias. Of course, each of the above-mentioned surrounding conductive tracks is, when necessary, separated from the surface on which it is formed by an insulating layer, not shown. Preferably, reflector 32 and all the surrounding conductive tracks are grounded. The bumps may, as shown, contact a peripheral portion of reflector 32 or contact a conductive track 46 surrounding this reflector or positioned on the periphery of the reflector 32.

Thus, the downward radiation of antenna 30 reflects on reflector 32 but cannot diverge to create parasitic waves, especially in the interposer plate 3, due to the tight network of vias 41 and bumps which surrounds the area separating the antenna from its reflector and forms a Faraday cage. Thus, any influence of an antenna 30 on the neighboring antennas and/or on integrated circuit chip 1 is avoided.

Figure 3:
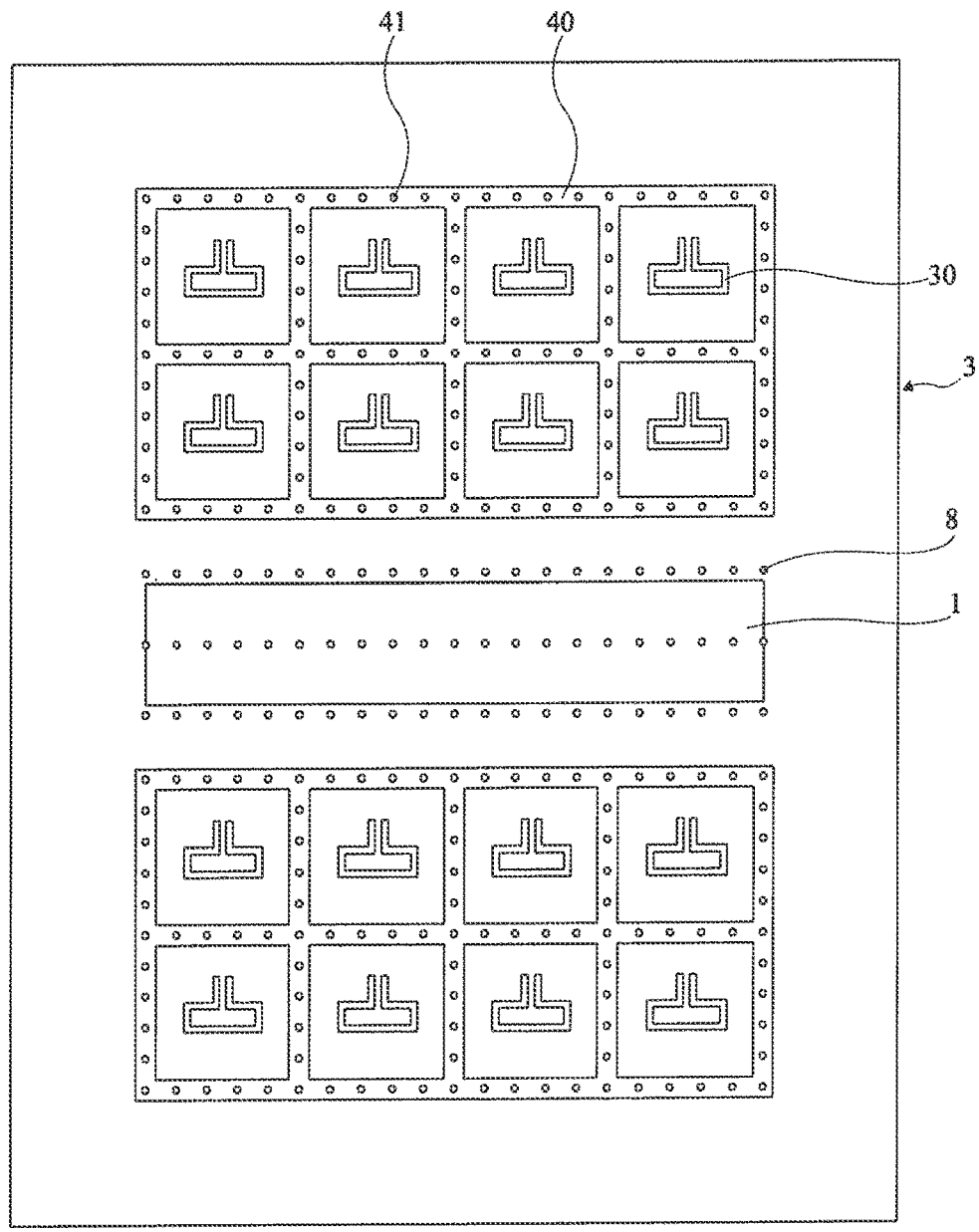
FIG. 3 is a general top view of a transceiver system.

FIG. 3 is a general view of the system. It shows, in its central portion, integrated circuit 1 and connection pads of this circuit intended to be connected to the above-mentioned pillars 6. Antennas 30, 16 being the shown example, are arranged on either side of integrated circuit 1. As indicated, these antennas 30 are surrounded respectively by conductive tracks 40 periodically connected by vias 41 to corresponding conductive tracks 42 formed on the lower surface 11 of the interposer plate 3.

This top view shows that each of the antennas is isolated from the neighboring ones and from the environment by the via-bump network provided herein.

Figure 4:
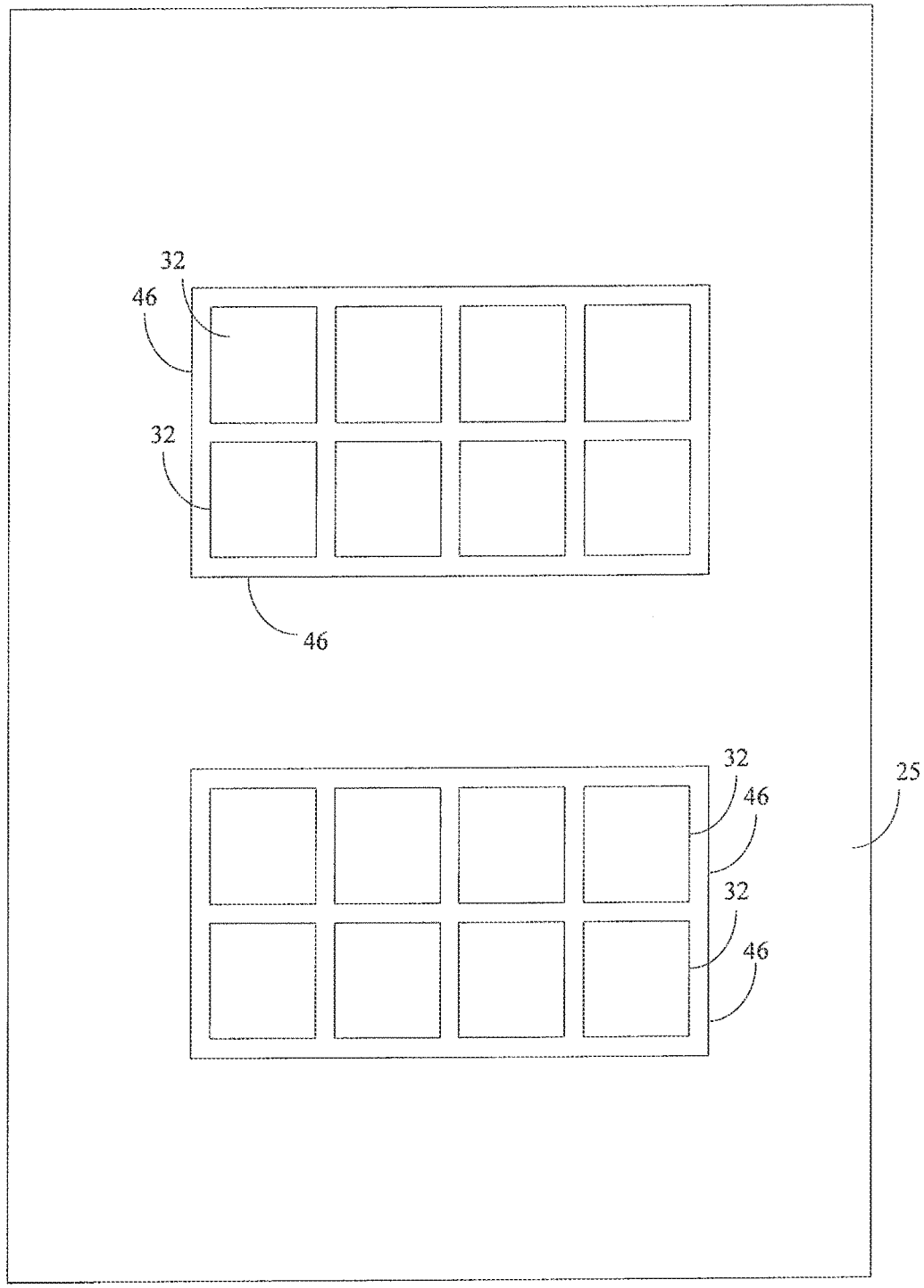
FIG. 4 is a top view of a printed circuit board of the transceiver system of FIG. 3.

FIG. 4 is a top view of the printed circuit board 25 of the transceiver system of FIG. 3. Positioned on the upper surface 13 of the printed circuit board 25 are a set of reflectors 32 corresponding respectively to the antennas 30 of FIG. 3. In the embodiment of FIG. 4, the reflectors 32 are respectively surrounded by conductive tracks 46. As discussed above, the conductive tracks 40, respectively surrounding the antennas 30, are electrically coupled by the conductive vias 41 to corresponding conductive tracks 42, which are respectively coupled by the bumps 44 to the corresponding conductive tracks 46 on the printed circuit board 25.

Of course, the present disclosure is likely to have various alterations, modifications, and improvements which will occur to those skilled in the art, especially as concerns the shape of the antennas. Further, the various metallization levels formed on the interposer plate 3, and especially the metallizations intended to connect the integrated circuit to each of the antennas, have not been described in detail. Indeed, these are common layouts. What matters is for all the metallizations to be arranged on a same surface of an interposer plate 3 and thus to have a minimum dimension.

As a variation, reflector 32, instead of being formed of a metallization, may be formed in a metal plate comprising upward-directed edges, this plate being attached to printed circuit board 25.

Such alterations, modifications, and improvements are intended to be part of this disclosure, and are intended to be within the spirit and the scope of the present disclosure. Accordingly, the foregoing description is by way of example only and is not intended to be limiting.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A transceiver, comprising:
  an interposer plate having an upper surface and a lower surface;

an interconnection network supported on the upper surface of the interposer plate;
a printed circuit board having an upper surface and supporting the interposer plate on the upper surface;
conductive bumps coupling the lower surface of the interposer plate to the upper surface of the printed circuit board;
an integrated circuit chip on the upper surface of the interposer plate and coupled to the interconnection network;
antennas made of tracks formed on the upper surface of the interposer plate; and
reflectors corresponding respectively to the antennas and positioned on the upper surface of the printed circuit board, each of the antennas being separated from the corresponding reflector by an effective distance on the order of one quarter of a wavelength of a millimeter wave.

2. The transceiver of claim 1, wherein the conductive bumps are polymer bumps coated with a conductor and with a solder layer.

3. The transceiver of claim 1, wherein the interposer plate includes a silicon plate.

4. The transceiver of claim 1, wherein the interposer plate includes a glass plate.

5. The transceiver of claim 1, comprising an encapsulation resin covering the integrated circuit chip and the interconnection network.

6. A transceiver, comprising:
an interposer plate having an upper surface and a lower surface;
a printed circuit board supporting the interposer plate on a surface;
an integrated circuit chip coupled to the interposer plate;
an antenna on the upper surface of the interposer plate;
an interconnection network on the upper surface of the interposer plate and coupled to the integrated circuit chip, the interconnection network configured to couple the integrated circuit chip to the printed circuit board through the interposer plate; and
a reflector on the surface of the printed circuit board and positioned under the antenna.

7. The transceiver of claim 6, comprising a plurality of connectors positioned between the interposer and the printed circuit board and configured to space apart the interposer and the printed circuit board from each other.

8. The transceiver of claim 7, wherein the connectors are polymer bumps coated with a conductor and with a solder layer.

9. The transceiver of claim 6, wherein the interposer plate includes a silicon plate.

10. The transceiver of claim 6, wherein the interposer plate includes a glass plate.

11. The transceiver of claim 6, comprising an encapsulation resin covering the integrated circuit chip and interposer plate.

12. A transceiver, comprising:
an interposer plate having an upper surface and a lower surface;
an interconnection network supported on the upper surface of the interposer plate;
a printed circuit board having an upper surface and supporting the interposer plate on the upper surface;
bumps coupling the lower surface of the interposer plate to the upper surface of the printed circuit board;
an integrated circuit chip on the upper surface of the interposer plate and coupled to the interconnection network;
a plurality of antennas made of tracks formed on the upper surface of the interposer plate, the plurality of antennas coupled to the integrated circuit chip; and
a plurality of reflectors formed on the upper surface of the printed circuit board, each of the plurality of reflectors positioned on the upper surface of the printed circuit board facing a corresponding one of the plurality of antennas, and each of the plurality of antennas being separated from the corresponding one of the plurality of reflectors by an effective distance on the order of one quarter of a wavelength of a millimeter wave.

13. The transceiver of claim 12, wherein the plurality of antennas form a phased array.

14. The transceiver of claim 12 further comprising a plurality of connectors positioned between the interposer and the printed circuit board and configured to space apart the interposer and the printed circuit board from each other.

15. The transceiver of claim 12, wherein the bumps are polymer bumps coated with a conductive layer and with a solder layer.

16. The transceiver of claim 12, wherein the interposer plate comprises one of a silicon plate and a glass plate.

17. The transceiver of claim 12 further comprising an encapsulation resin formed over the integrated circuit chip and the interconnection network.

18. The transceiver of claim 12 further comprising a plurality of connectors positioned between the interposer plate and the printed circuit board that space apart the interposer plate and the printed circuit board from each other.

19. The transceiver of claim 12, wherein the plurality of antennas receive and transmit millimeter wave signals.

* * * * *